(12) United States Patent
Bettner

(10) Patent No.: US 6,181,225 B1
(45) Date of Patent: Jan. 30, 2001

(54) LASER TUNABLE THICK FILM MICROWAVE RESONATOR FOR PRINTED CIRCUIT BOARDS

(75) Inventor: Allen W. Bettner, Los Gatos, CA (US)

(73) Assignee: Itron, Inc., Spokane, WA (US)

( * ) Notice: Under 35 U.S.C. 154(b), the term of this patent shall be extended for 0 days.

(21) Appl. No.: 09/250,816

(22) Filed: Feb. 17, 1999

Related U.S. Application Data

(60) Provisional application No. 60/074,959, filed on Feb. 17, 1998.

(51) Int. Cl.⁷ .................................. H01P 7/00; H01P 1/20
(52) U.S. Cl. ............................ 333/235; 333/204; 333/205
(58) Field of Search ....................................... 333/202, 204, 333/235, 205

(56) References Cited

U.S. PATENT DOCUMENTS

| | | |
|---|---|---|
| 4,157,517 | 6/1979 | Kneisel et al. . |
| 4,288,530 | 9/1981 | Bedard et al. . |
| 4,603,311 * | 7/1986 | Mage .................... 333/202 |
| 4,639,690 | 1/1987 | Lewis . |
| 5,014,024 | 5/1991 | Shimizu et al. . |
| 5,097,237 * | 3/1992 | Komazaki et al. ............. 333/204 |
| 5,198,788 | 3/1993 | Phillips et al. . |
| 5,304,966 | 4/1994 | Hino et al. . |
| 5,321,374 | 6/1994 | Uwano .................... 333/202 |
| 5,344,695 | 9/1994 | Hirai et al. . |
| 5,373,271 | 12/1994 | Hirai et al. . |
| 5,398,399 | 3/1995 | Block et al. . |
| 5,420,554 | 5/1995 | Gehrke . |
| 5,534,830 | 7/1996 | Ralph . |
| 5,572,779 | 11/1996 | Adelman et al. . |
| 5,640,699 | 6/1997 | Ralph . |

FOREIGN PATENT DOCUMENTS

| | | |
|---|---|---|
| 3-73602 | 3/1991 | (JP) . |
| 5-211404 | 8/1993 | (JP) . |
| WO 99/14820 | 9/1998 | (WO) . |

* cited by examiner

*Primary Examiner*—Benny Lee
*Assistant Examiner*—Patricia T. Nguyen
(74) *Attorney, Agent, or Firm*—Patterson, Thuente, Skaar & Christensen, P.A.

(57) ABSTRACT

The resonator of the present invention is preferably made of low cost alumina offering performance in a variable frequency oscillator application that is nearly equivalent to that of a high Q dielectric design. The resonator structure is tunable over a wide range with substantially no effect on oscillator phase noise or signal amplitude. The resonator utilizes a unique geometric structure which employs a transmission line preferably on alumina, conducting via holes (called castellations) and a topside ground pattern formed with a thick film of silver and/or palladium. A plurality of resonators may be formed by a step and repeat pattern then snapped apart for low cost, high volume manufacture. The resonator may be tuned in both a vertical and horizontal direction by removing topside metal from the resonator, to raise and lower the frequency, until the desired frequency is met. Low phase noise is preferably achieved by using a slab resonator that is short in length in combination with a fairly large loading capacitor. This provides maximum phase change versus frequency, and the best phase noise response of the oscillator.

31 Claims, 11 Drawing Sheets

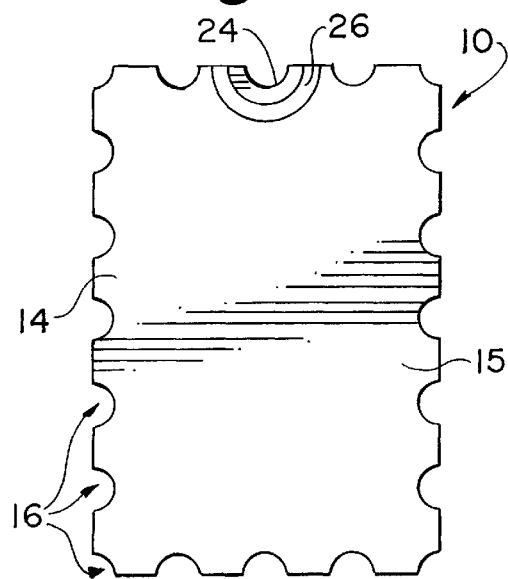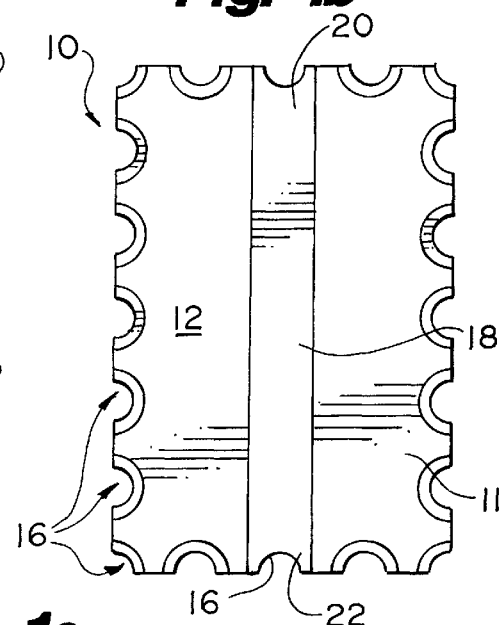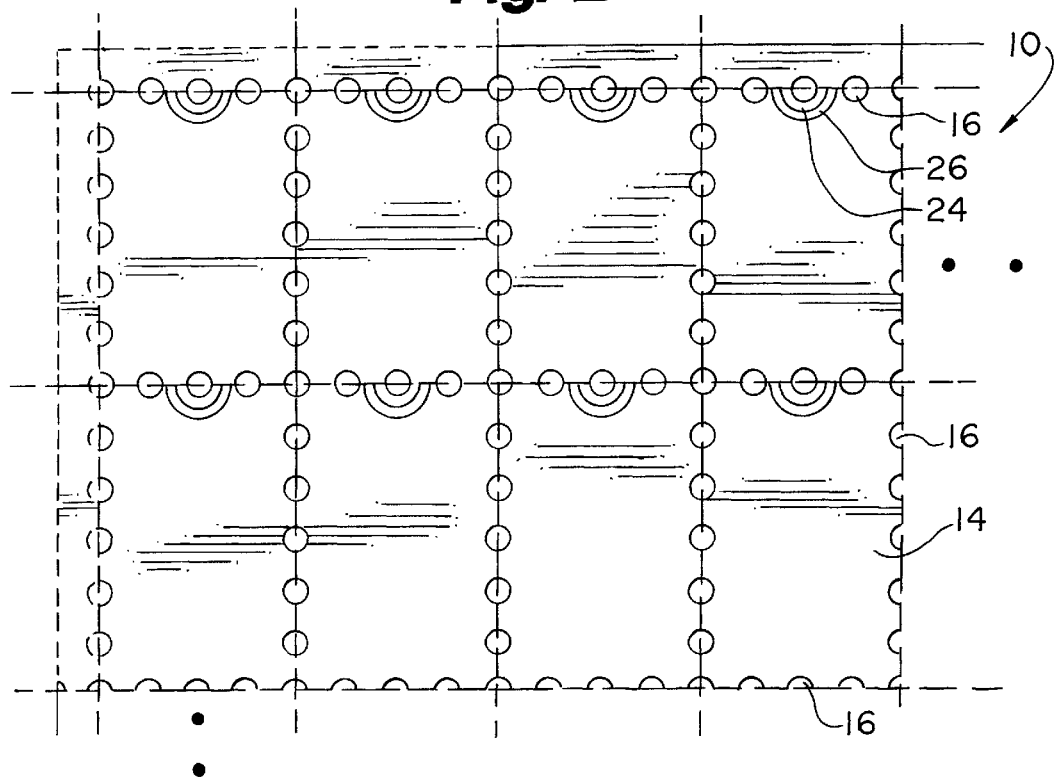

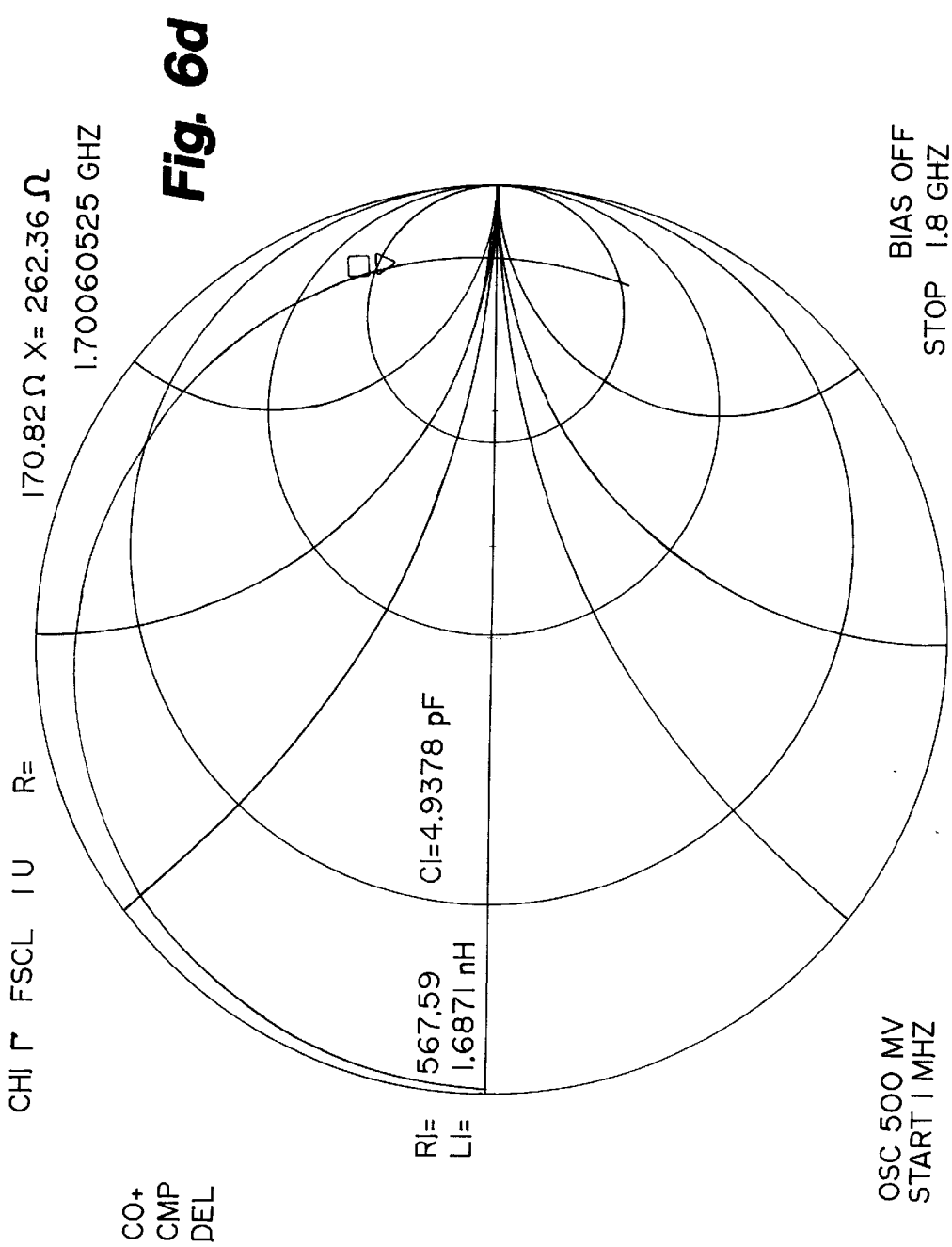

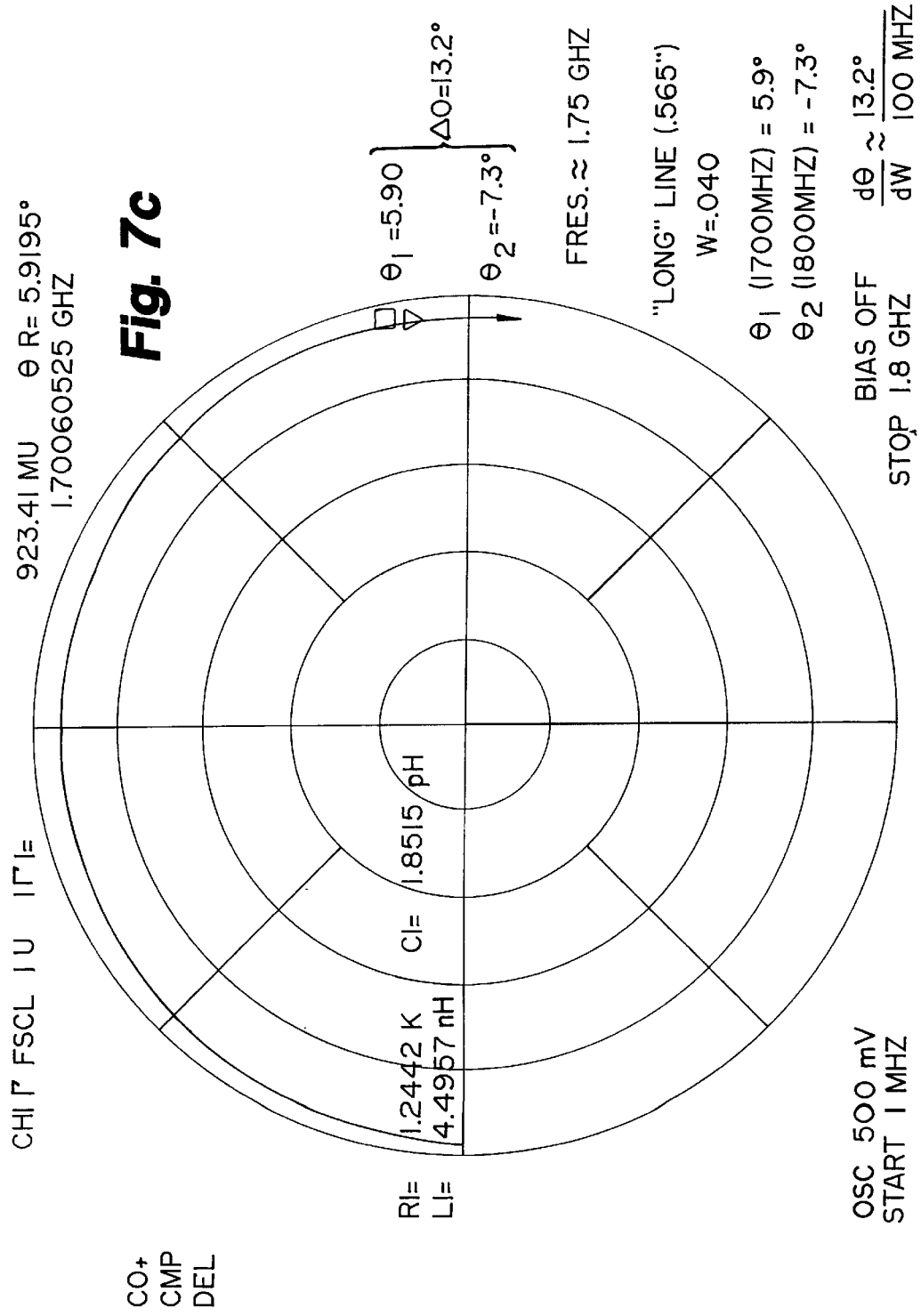

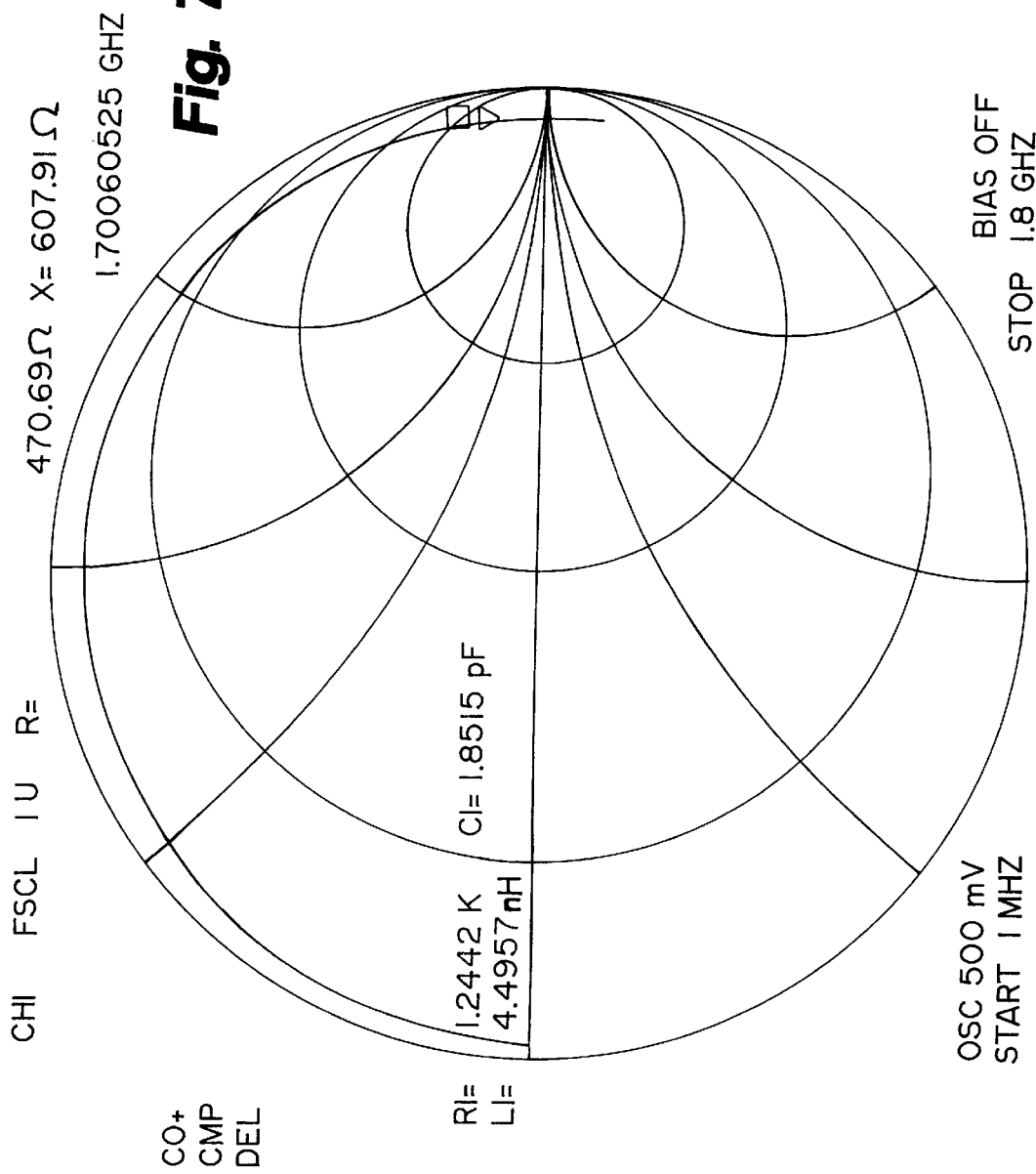

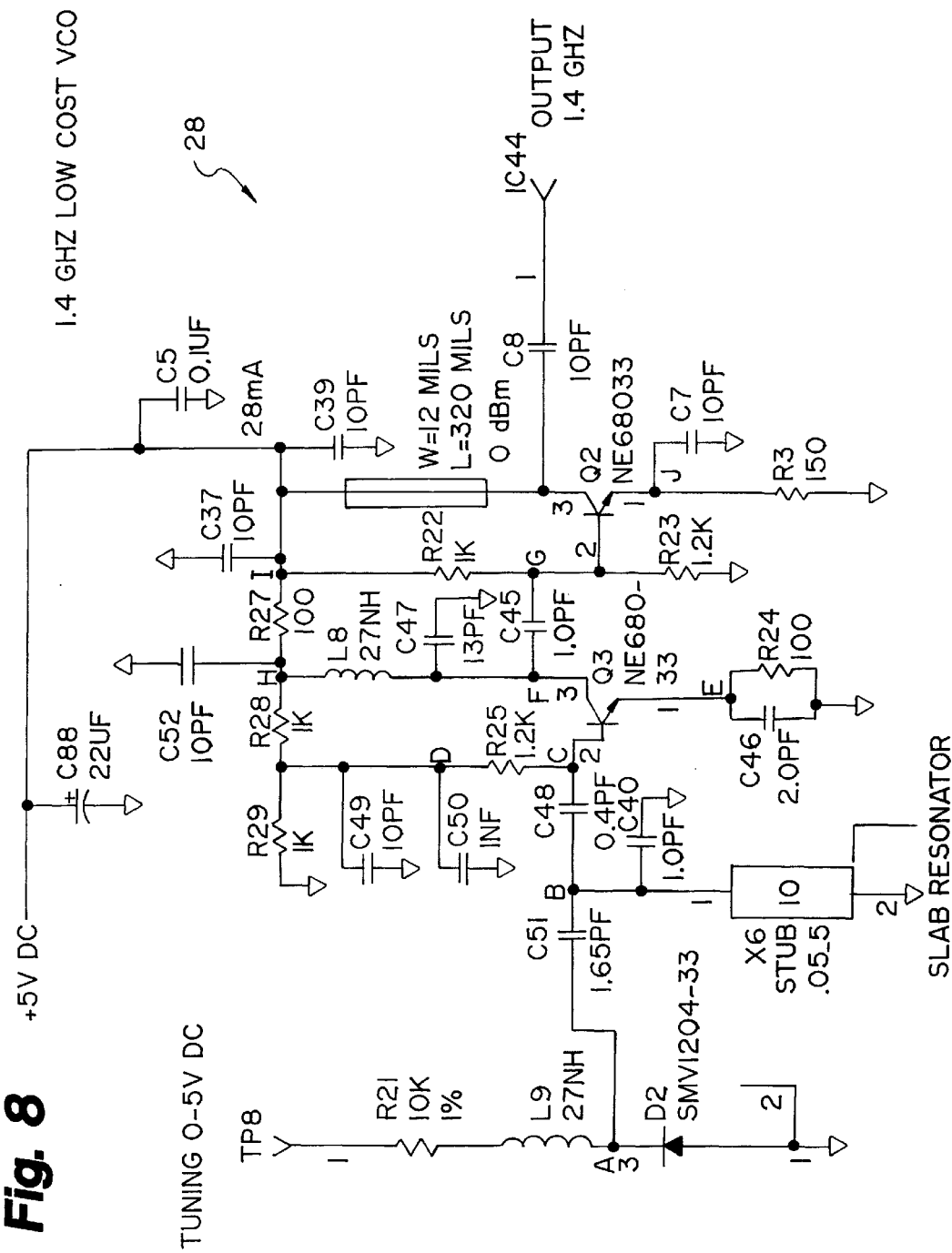
Fig. 8  1.4 GHZ LOW COST VCO

LASER TUNABLE THICK FILM MICROWAVE RESONATOR FOR PRINTED CIRCUIT BOARDS

This application claims priority to U.S. provisional application having Ser. No. 60/074,959, filed Feb. 17,1998 and entitled "Alumina Thickfilm Slabline Resonator", incorporated herein by reference.

BACKGROUND OF THE INVENTION

Many radio frequency oscillators today depend on the use of high dielectric coaxial resonators to establish the frequency of oscillation. These resonators are generally available off the shelf or can be customized to a particular frequency. The resonators are small, but relatively expensive, e.g. more than 20 times, in comparison with common surface mount parts such as resistors and capacitors. However, where high performance and stability are needed there are few alternatives.

In the case of a variable frequency oscillator, the frequency of the resonator needs to be pulled above or below the natural frequency of oscillation. This is normally done by shunting the resonator with a varactor diode, which changes in capacitance depending on the DC voltage at its terminals. Adding this component unfortunately lowers the performance, as the varactor is subject to more loss than the resonator. As the tuning range is made wider, the loading by the varactor becomes more significant, reducing the benefit of the original resonator in terms of its high performance and good phase noise performance. In short, the use of an expensive dielectric resonator becomes difficult to justify in a circuit where the quality factor, Q, is impaired by other components connected to it.

In these cases where the resonator Q of the oscillator becomes heavily dominated by the varactor or other tuning components, the use of a high Q resonator has little effect on the overall loaded Q.

In an attempt to overcome some of these problems, various alternative resonators have been proposed. For instance, U.S. Pat. No. 5,420,554 discloses a method and apparatus for adjusting a resonant frequency of a transmission line resonator assembly. The '554 patent uses laser tuning to center the resonant frequency. The tuning is accomplished by deflecting a metallized plastic assembly that is located directly atop a resonator electrode. However, the '554 patent does not make clear how deflection, and thus tuning, is made permanent. Further, the '554 device is fabricated on a printed circuit board rather than using thick film technology, which would allow for surface mounting in numerous applications.

In view of the above, there is a need for a low cost resonator that can offer performance that is nearly equivalent to the performance offered by a high Q coaxial dielectric design.

SUMMARY OF THE INVENTION

The problems addressed above are in large part solved by a resonator of the present invention. The resonator structure is made of low cost alumina offering performance in a variable frequency oscillator application that is nearly equivalent to that of a high Q dielectric design. The resonator structure is tunable over a wide range with substantially no effect on oscillator phase noise or signal amplitude. The resonator utilizes a unique geometric structure which employs a transmission line preferably on alumina, conducting via holes (called castellations) and a topside ground pattern formed with a thick film of silver and/or palladium. A plurality of resonators may be formed by a step and repeat pattern then snapped apart for low cost, high volume manufacture. The resonator may be tuned in both a vertical and horizontal direction by removing topside metal from the resonator, to raise and lower the frequency, until the desired frequency is met. Low phase noise is preferably achieved by using a slab resonator that is short in length in combination with a fairly large loading capacitor to optimally match the impedance of the oscillator active device (transistor).

DESCRIPTION OF THE DRAWINGS

FIGS. 1A, 1B and 1C depict a topside view, a backside view and a side view, respectively, of a microwave tunable slab resonator of the present invention.

FIG. 2 depicts the step and repeat pattern that is preferably used in creating a plurality of slab resonators.

FIG. 6D depicts the impedance of the short slab resonator configuration.

FIG. 7C depicts the phase response of the long slab configuration.

FIG. 7D depicts the impedance of the long slab configuration.

FIG. 8 depicts one example application of the slab resonator.

DESCRIPTION OF THE PREFERRED EMBODIMENTS

Figure 3A:
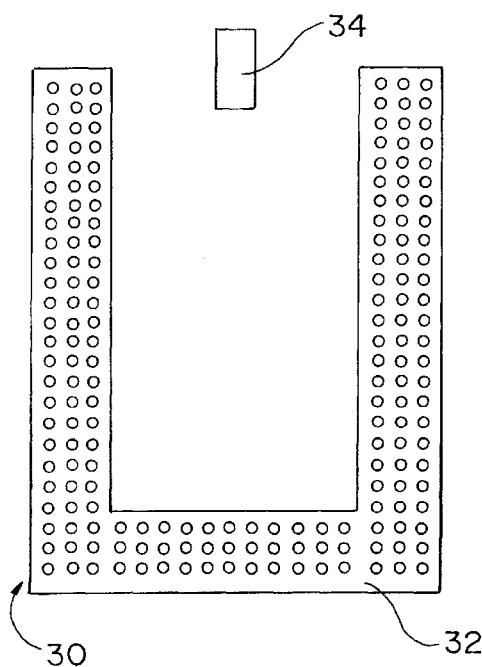
FIG. 3A depicts a printed circuit board (PCB) footprint onto which the slab resonator may be mounted.

FIGS. 1A, 1B and 1C depict a slab resonator 10 of the present invention. Slab resonator 10 preferably comprises a "slab" 11 of alumina having a bottom side 12 and a thick film, metallized top side 14. Top side 14 is preferably metallized with palladium or silver creating a top side ground pattern 15. By way of illustrative example, slab resonator 10 is appropriately 0.5 inches in length, 0.3 inches in width and 0.025 inches in thickness, of course other dimensions may be used without departing from the spirit or scope of the invention. A plurality of metallized, conducting vias 16 surround the perimeter of slab resonator 10. As with top side 14, vias 16 are preferably plated with palladium or silver. Bottom side 12 of slab 11 includes a transmission line 18 having a proximal end 20 and a distal end 22, proximal end 20 defining a positive terminal 24. Transmission line 18 preferably comprises a palladium or silver metallized strip. Positive terminal 24 is isolated from top side ground pattern 15 by a "moat" geometry 26. Distal end 22 of transmission line 18 is connected to top side 14 through use of a plated via 16. The other plated vias 16 operate to provide a connection between metallized top side 14 and bottom side 12.

FIG. 2 depicts how vias 16 and "moat" geometry 26 are preferably formed through laser scribing. The laser scribing is achieved through the indicated step and repeat pattern. In this manner, a plurality of slab resonators 10 may be created at a single time. With the laser scribing completed, slab resonators 10 can easily be snapped apart for low-cost, high-volume manufacture.

Figure 3B:
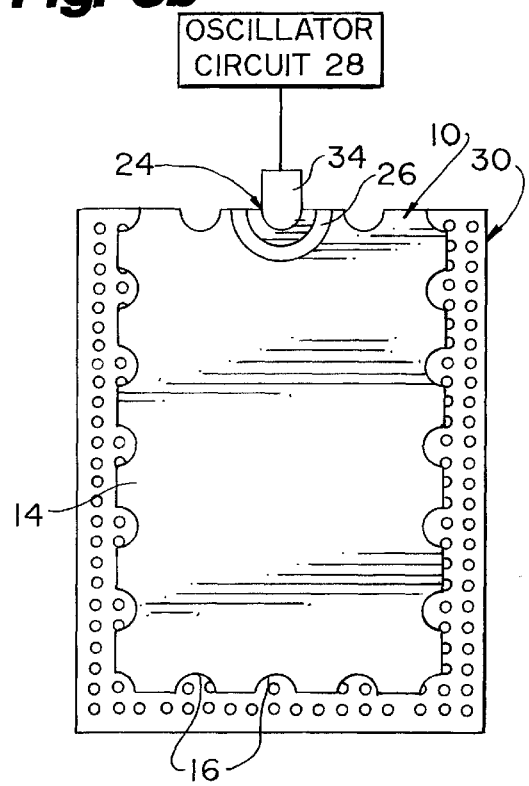
FIG. 3B depicts the slab resonator mounted to the PCB of FIG. 3A.

FIG. 3A depicts a printed circuit board (PCB) footprint for slab resonator 10. Slab resonator 10 is preferably incorporated into a parent oscillator circuit 28 by direct soldering, e.g. using surface mount technology (SMT), to a host PCB 30, see FIG. 3B, of parent oscillator circuit 28. The PCB 30 is preferably of 0.062 inch FR-4 with a copper, grounded metal pattern and is preferably in the shape of a horseshoe. The horseshoe-shaped, grounded metal pattern 32 allows solder to flow from PCB 30 ground up the sides of slab resonator 10. Connection to the positive terminal 24 of slab resonator 10 is made through a surface mount to a separate, positive terminal contact 34 on PCB 30.

Figure 4:
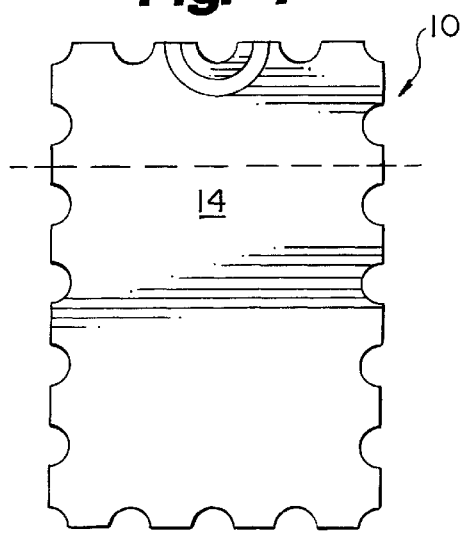
FIG. 4 depicts horizontal trimming of the slab resonator.
Figure 5:
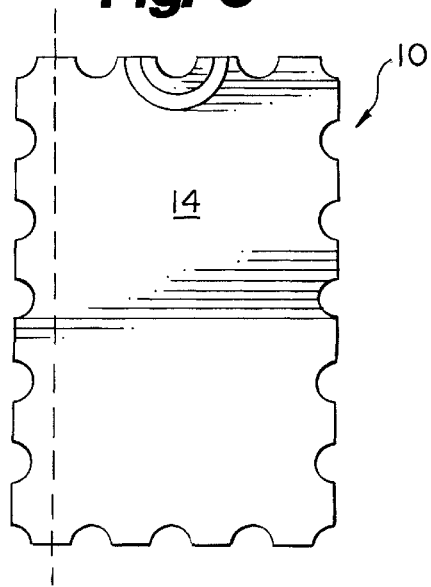
FIG. 5 depicts vertical trimming of the slab resonator.

In operation, upon DC turn on, oscillator circuit 28 oscillates at the natural frequency of slab resonator 10 (including PCB effects and loading). Tuning the frequency of oscillator circuit 28 is a matter of trimming, e.g. of removing top side 14 metal from slab resonator 10 until the desired frequency is met. Trimming along a horizontal direction, as shown in FIG. 4, lowers the frequency of oscillator circuit 28. The horizontal trimming acts to raise the impedance of transmission line 18 making it more inductive and, thereby, lowering oscillator frequency. Trimming along a vertical direction, as shown in FIG. 5, raises the frequency of oscillator circuit 28. The vertical trimming acts to reduce capacitive loading of slab resonator 10 and, thereby, raises frequency.

The tuning of slab resonator 10 may be performed either manually or by using laser trimming techniques. Manual trimming is preferably performed by using a small grinding tool while laser trimming is generally performed by using a commercial laser trimmer with a program to iteratively seek the frequency desired. The preferred method of tuning slab resonator 10 is via laser trimming. The laser trimmer may iteratively trim both horizontally and vertically to precisely achieve the desired operating frequency. With the ability to adjust frequency both up and down (i.e. trim vertically and horizontally, respectively), a misstep in tuning is not a catastrophe. For instance, if the laser trimmer were to "overshoot" the desired frequency, that desired frequency could still be obtained by additional vertical or horizontal trimming; no external tuning or resonator replacement is required. Slab resonator 10 is tunable over a wide range with substantially no effect on oscillator phase noise or signal amplitude. Note that while typical coaxial dielectric resonators can be adjusted by grinding off a metal jacket, there is usually a severe tradeoff of performance (Q) if too much metal is removed.

The inexpensive, slab resonator 10 is able to achieve phase noise levels, in the 900–1400 MHz range, that rival expensive, dielectric transmission line devices. However, in order for slab resonator 10 to realize these low phase noise levels, the characteristic impedance of slab resonator 10 must be properly set. Research performed during the development of slab resonator 10 shows that using a short slab 10 with a relatively large capacitance results in improved phase noise compared with a long slab and little or no capacitance.

Figure 6A:
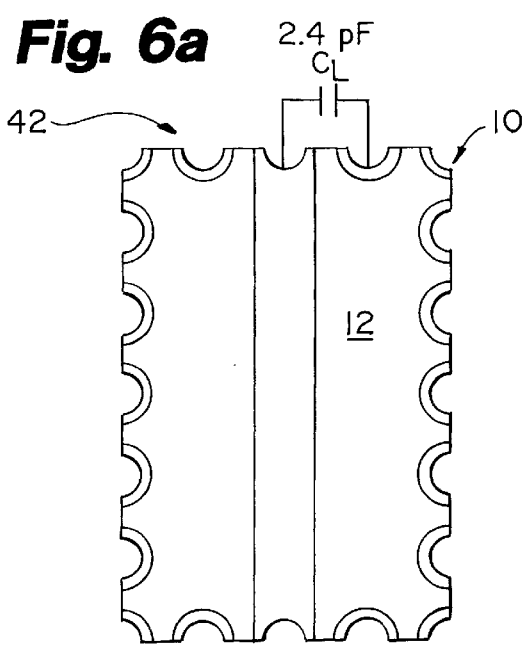
FIG. 6A depicts a short slab resonator configuration.
Figure 6B:
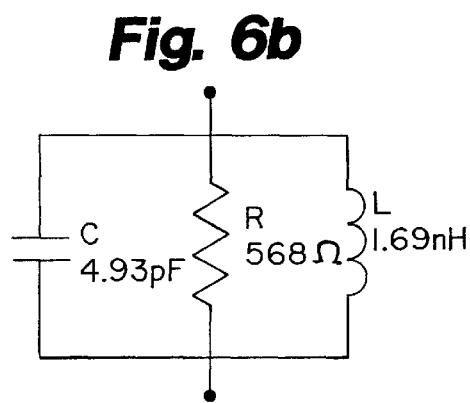
FIG. 6B depicts an equivalent circuit of the short slab resonator of FIG. 6A.
Figure 6C:
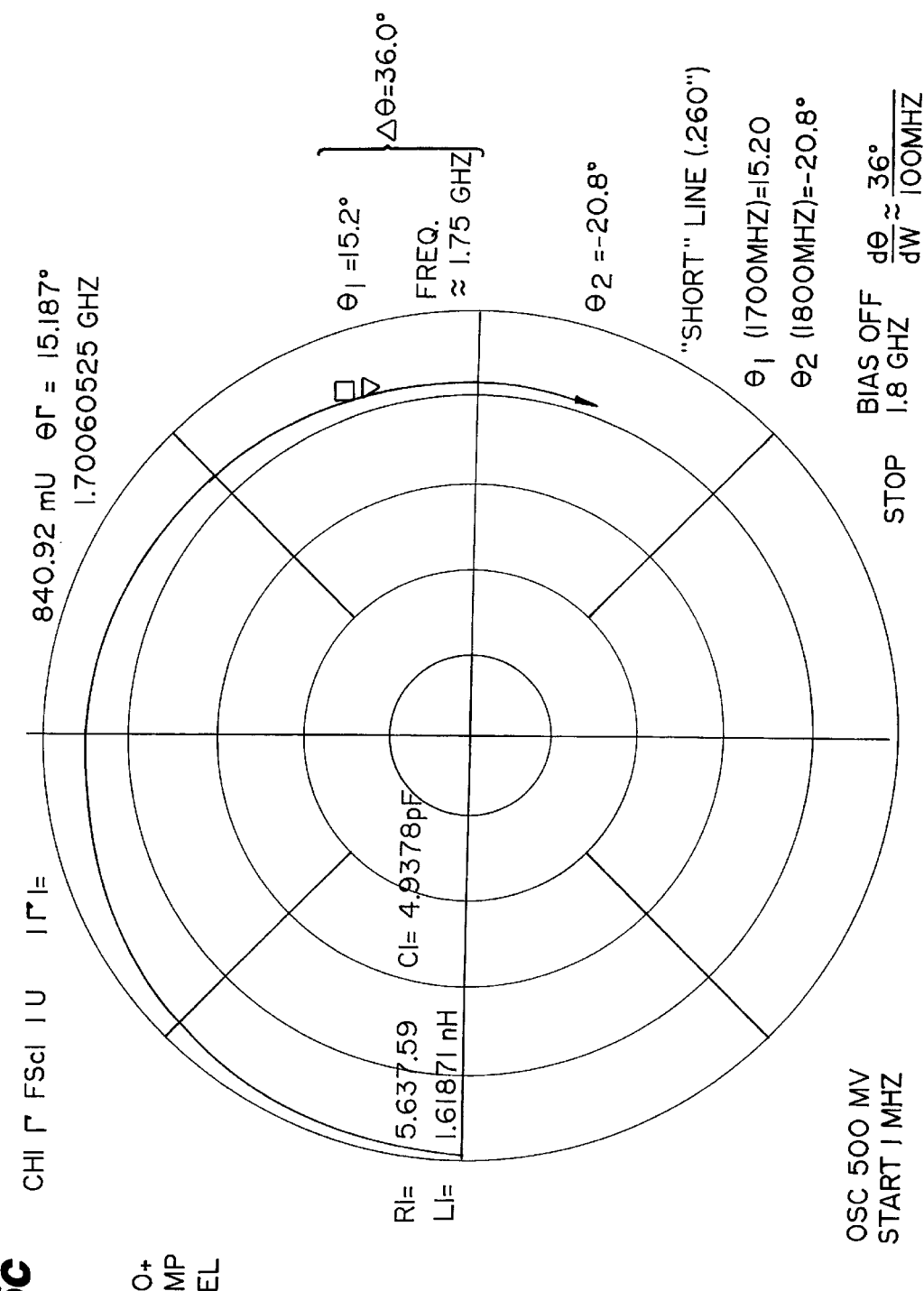
FIG. 6C depicts the phase response of the short slab resonator configuration.

FIG. 6A, depicts, by way of non-limiting example, a short slab resonator, 0.260 inches in length, and an appropriate large, resonating capacitance connected in parallel. Near resonance, the short slab resonator 10 can be modeled as a simple LRC parallel resonator. As such, the equivalent LRC circuit of FIG. 6A is provided in FIG. 6B. The values for L, R and C were determined using an HP 4291A RF impedance analyzer. The determination of the unloaded Q of the short slab configuration may be calculated as follows:

$$Q = \omega RC = 30.83 \quad (1)$$

where: $\omega = 2\pi f_{res} = 2\pi(1.75 \text{ GHz})$;
R = 568 Ω;
C = 4.94 pF; and,
L = 1.68 nH The phase response, or $d\theta/d\omega$, of the short slab configuration may be calculated as follows, utilizing data points from the polar phase plot of short slab resonator in FIG. 6C:

Data Points: At 1.70 GHz, $\theta = 15.2°$;
At 1.80 GHz, $\theta = -20.8°$; then, $$\frac{d\theta}{d\omega} = \frac{36.0°}{100 \text{ MHz}}. \quad (2)$$

FIG. 6D provides a polar impedance plot of short slab resonator.

Figure 7A:
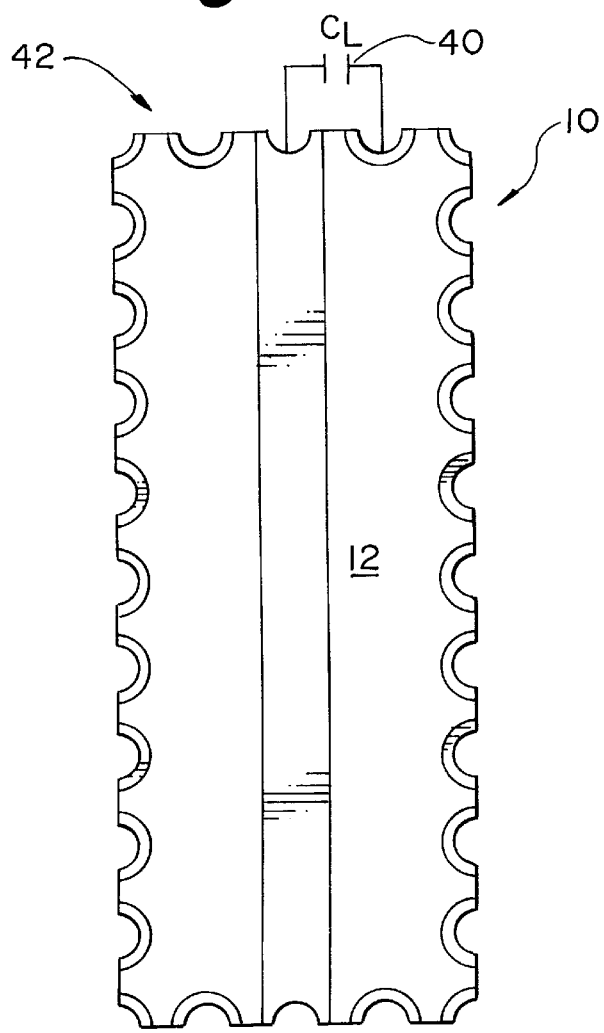
FIG. 7A depicts a long slab resonator configuration.
Figure 7B:
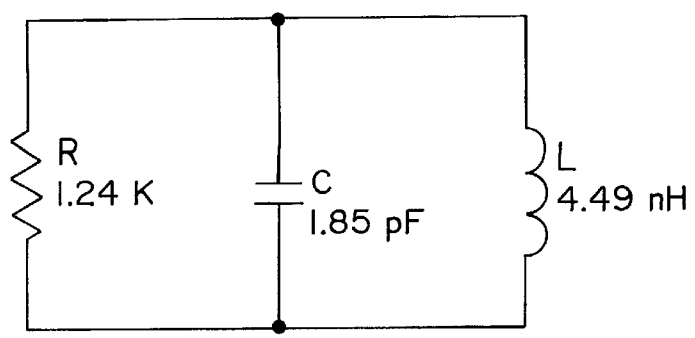
FIG. 7B depicts an equivalent circuit of the long slab resonator of FIG. 7A.

FIG. 7A, depicts, by way of non-limiting example, a long slab resonator, 0.565 inches in length, and a small capacitance. Near resonance, the long slab resonator 10 can be modeled as a simple LRC parallel resonator. As such, the equivalent LRC circuit of FIG. 7A is provided in FIG. 7B. The values for L, R, and C were determined using an HP 4291A RF impedance analyzer. The determination of the unloaded Q of the long slab configuration may be calculated as follows:

$$Q = \omega RC = 25.21 \quad (3)$$

where: $\omega = 2\pi f_{res} = 2\pi(1.75 \text{ GHz})$;
R = 1.24 kΩ;
C = 1.85 pF; and,
L = 4.49 nH.

The phase response, or $$\frac{d\theta}{d\omega},$$

of the long slab configuration may be calculated as follows, utilizing data points from the polar phase plot of long slab resonator in FIG. 7C:

Data Points: At 1.7 GHz, $\theta = -5.9°$; (4)

At 1.8 GHz, $\theta = 7.3°$; then, $$\frac{d\theta}{d\omega} = \frac{13.2°}{100 \text{ MHz}}.$$

FIG. 7D provides a polar impedance plot of long slab resonator.

The above calculations indicate that, although the unloaded Q and resonant frequency ($f_{res}$) of each of these configurations is roughly equivalent, the L-to-C ratio makes a noticeable difference in performance. That is, the phase response of the short slab configuration is much sharper (data indicates more than twice as sharp) as the long slab resonator configuration. As such, to achieve optimum operation of slab resonator 10, a resonating, loading capacitor 40 should be included to complete a resonating structure 42.

The use of capacitor 40 adds only a modest cost to slab resonator 10, making resonating structure 42, i.e. slab resonator 10 and capacitor 40, an inexpensive and viable alternative to expensive dielectric transmission line resonators. Further, capacitor 40 has no special soldering or mounting requirements, it is simply added between transmission line 18 of slab resonator and ground.

Note that at 1 GHz, the optimal size of slab resonator 10 is 0.650 inches long by 0.375 inches wide for either a 950 MHz or 1400 MHz application. For the 950 MHz application, capacitor 40 is preferably 3.8 pF while for the 1400 MHz application, capacitor 40 is preferably 1.0 pF. If slab resonator 10 is too long, the tuning range will be good, i.e. extended, but the phase noise will be poor. If slab resonator 10 is too short, the phase noise will be good but the oscillator will be stiff and have a limited tuning bandwidth due to the "swamping" effect of the parallel capacitor 40. The optimal size, as described immediately above, provides a tuning range of more than 50 MHz at 1400 MHz and 25 MHz at 950 MHz.

Slab resonator 10 was tested in a parent oscillator circuit 28, specifically, a 1.4 GHz voltage controlled oscillator (VCO) application. A slab resonator 10 of 15 mil alumina was used. A schematic of the VCO application is provided in FIG. 8. As shown, a 0–5 Volt DC input is provided to resistor R21 which is in series with inductor L9, L9 connected to node A. Diode D2 is connected between node A and ground. Capacitor C51 is connected between nodes A and B. Loading capacitor, indicated as C40, is connected between node B and ground. Slab resonator 10 is also connected between node B and ground. Capacitor C48 is connected between node B and node C, which is tied to the base of transistor Q3. Resistor R25 is connected between node C and D. Capacitors C50 and C49 and resistor R29 are connected in parallel between node D and ground. The emitter of Q3 is tied to node E while capacitor C46 and resistor R24 are connected, in parallel between node E and ground. The collector of Q3 is tied to node F. Capacitor C45 is connected between nodes F and G. Capacitor C47 is connected between node F and ground. Inductor L8 is connected between nodes F and H. Also connected to node H is resistor R28, also connected to node D, capacitor C52, tied between H and ground, and resistor R27, connected between H and node I. Capacitor C 37 is tied between node I and ground, as are capacitors C39, C5 and C88. Positive 5 volts is supplied to node I. Resistor R22 is connected between nodes I and G. Node G is connected to the base of transistor Q2. Resistor R23 extends between node G and ground. The collector of Q2 is tied to node I via a transmission line. Capacitor C8 is connected between node I and the circuit output. The emitter of Q2 is connected to node J. Capacitor C7 and resistor R3 are connected, in parallel, between node J and ground.

Figure 9A:
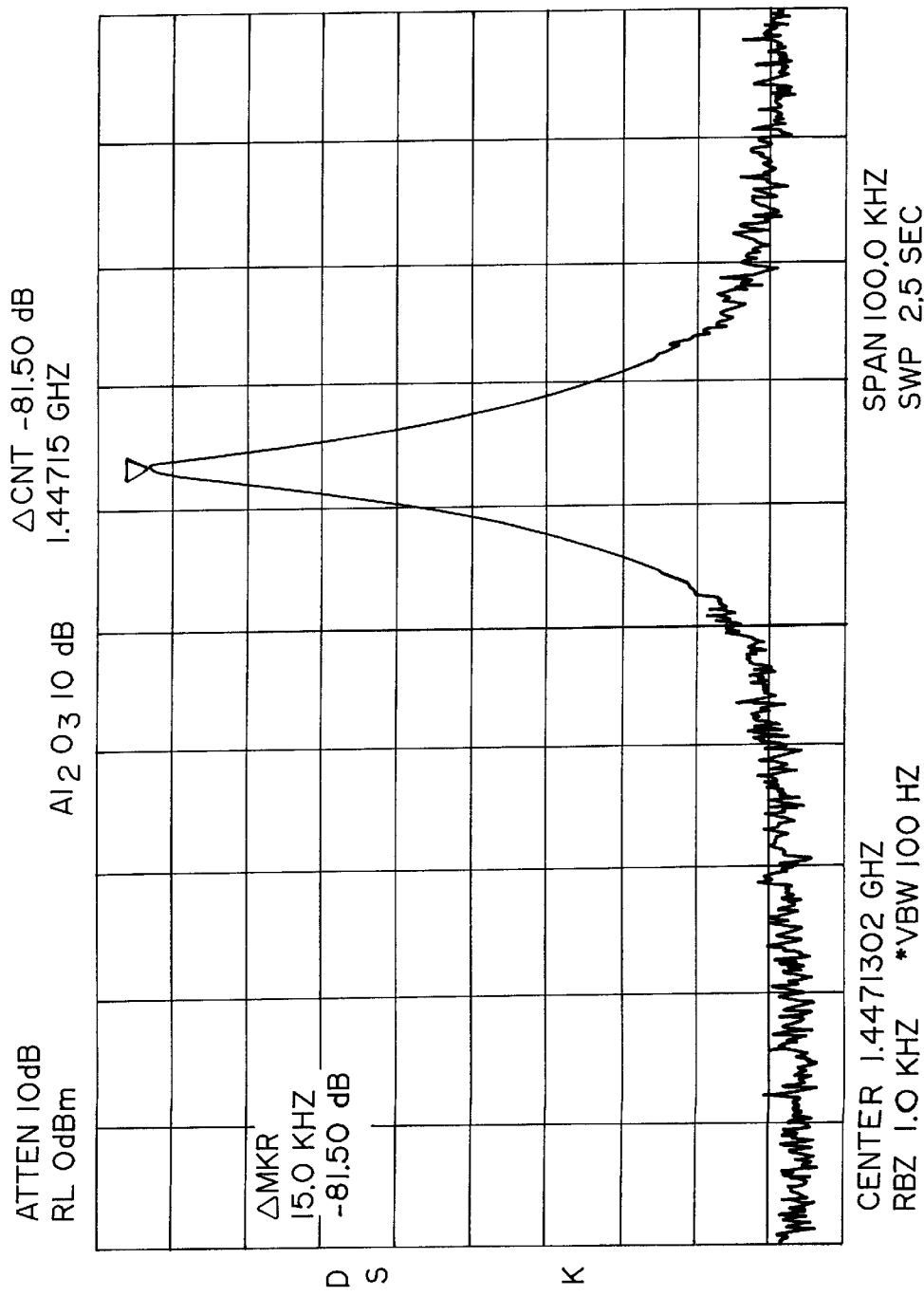
FIG. 9A depicts the results obtained from the application of FIG. 8.
Figure 9B:
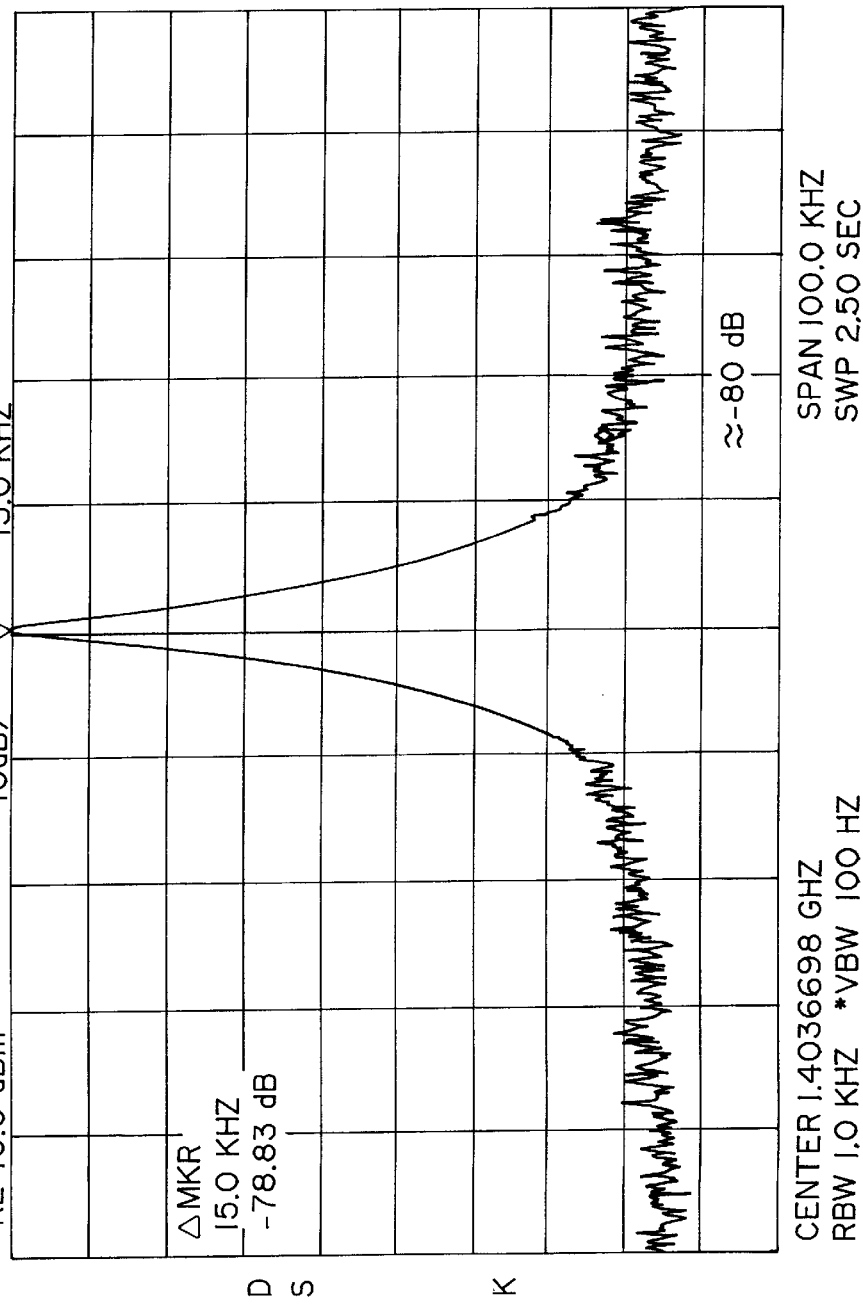
FIG. 9B depicts the results obtained using a conventional dielectric resonator in the application of FIG. 8.

The test results indicate a phase noise of better than 110 dBc/Hz at 15 KHz offset, with a tuning range of nearly 60 MHz from 1 to 5V, the data from the test is provided in FIG. 9A. The results of the test essentially equal those obtained using a conventional dielectric resonator in the same circuit. For example, see FIG. 9B, which depicts the results of a standard oscillator circuit that employs a standard dielectric resonator that has the same tuning range as the slab resonator. The phase noise for oscillator circuit 28 with slab resonator 10 is virtually identical to an oscillator with a standard dielectric resonator, i.e. approximately −80 dBc (phase noise for slab resonator is −81.5 dBc and phase noise for dielectric resonator is −78.83 dBc).

Slab resonator 10 has numerous applications which include, but are not limited to, mobile meter reading applications, fixed network meter reading applications, hand-held meter reading applications as well as numerous other radio frequency applications. Slab resonator 10 may be applied to virtually any VCO application.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A resonator having a resonant frequency that is adjustable, comprising:
   a base having a bottom side and a top side, wherein said bottom side includes a transmission line and said top side includes a metallized thick film;
   a plurality of conducting vias electrically connecting said transmission line and said thick film; and
   wherein said resonant frequency is altered by trimming said thick film in a first direction.

2. The resonator of claim 1, wherein said resonant frequency is oppositely altered by trimming said thick film is a second direction.

3. The resonator of claim 1, wherein said thick film is formed by laser trimming.

4. The resonator of claim 1, wherein said base includes alumina.

5. The resonator of claim 1, wherein said thick film comprises a substance selected from the group consisting of silver, palladium, and a mixture thereof.

6. The resonator of claim 1, further comprising a capacitor, wherein said capacitor is operably coupled between said transmission line and an electrical ground.

7. The resonator of claim 6, wherein said capacitor is in the range of 1.0 pF to 4.0 pF.

8. The resonator of claim 1, wherein said base has a length between about 0.2 inches and 0.35 inches.

9. The resonator of claim 1, wherein said base includes a perimeter and wherein said perimeter includes said plurality of vias.

10. The resonator of claim 9, wherein said plurality of vias are formed through laser scribing.

11. The resonator of claim 1, wherein said resonant frequency is between about 900 and 1400 MHz.

12. A resonator having a frequency that is adjustable comprising:
    a base having a bottom side and a top side, said bottom side including a transmission line, said top side including a metallized thick film;
    a plurality of conducting vias electrically connecting said transmission line and said thick film;
    means for transmitting said frequency;
    adjustment means operably coupled to said means for transmitting, for adjusting said frequency; and
    wherein said adjustment means alters said frequency in a first direction.

13. The resonator of claim 12, wherein said adjustment means alters said frequency in a second direction.

14. The resonator of claim 12, wherein said adjustment means comprises laser trimming.

15. The resonator of claim 12, wherein said adjustment means comprises a metallic, thick film.

16. The resonator of claim 15, wherein said metallic thick film comprises a material selected from the group consisting of silver, palladium, and any mixture thereof.

17. The resonator of claim 12, wherein said resonator is configured to operate in the range of 900 to 1400 MHz.

18. A method of achieving a desired frequency of a resonator having a starting frequency distinct from said desired frequency, wherein said resonator comprises a base having a bottom side, a top side, and a plurality of conducting vias, wherein said bottom side includes a transmission line and said top side includes a metallized thick film, and wherein said top side is operably coupled to said bottom side, the plurality of vias electrically connecting the transmission line and thick film, the method comprising the steps of:

trimming said thick film along a first direction to raise the frequency of said resonator if necessary to achieve said desired frequency;

trimming said thick film along a second direction to lower the frequency of said resonator if necessary to achieve said desired frequency;

repeating said trimming steps if necessary to achieve said desired frequency.

19. The method of claim 18, wherein said trimming steps are performed manually.

20. The method of claim 18, wherein said trimming steps are performed with a laser.

21. The method of claim 18, wherein said thick film is selected from the group consisting of silver, palladium, and any mixture thereof.

22. A resonator comprising:

a base having a bottom side and a top side, wherein said bottom side includes a transmission line and said top side includes a thick film, and wherein said transmission line is separated from said thick film by a moat, and wherein said transmission line is in electrical communication with said thick film by a plurality of conducting vias.

23. The resonator of claim 22, wherein said base has a perimeter and wherein said plurality of conducting vias are spaced about said perimeter.

24. The resonator of claim 22, wherein said base comprises alumina.

25. The resonator of claim 22, wherein said thick film is selected from the group consisting of silver, palladium, and any mixture thereof.

26. The resonator of claim 22, further comprising a capacitor, wherein said capacitor is operably connected between said transmission line and an electrical ground.

27. The resonator of claim 26, wherein said capacitor is in the range of 1.0 pF to 4.0 pF.

28. The resonator of claim 22, wherein said base has a length in the range of 0.2 inches to 0.35 inches.

29. The resonator of claim 22, wherein said moat and said plurality of conducting vias are created by laser scribing.

30. The resonator of claim 22, wherein said resonator operates in the range of 900 to 1400 MHz.

31. The resonator of claim 22, wherein a resonator resonant frequency is increased by trimming said thick film in a first direction and wherein said resonator resonant frequency is decreased by trimming said thick film in a second direction.

* * * * *

UNITED STATES PATENT AND TRADEMARK OFFICE
CERTIFICATE OF CORRECTION

PATENT NO. : 6,181,225 B1
DATED : January 30, 2001
INVENTOR(S) : Bettner

Page 1 of 1

It is certified that error appears in the above-identified patent and that said Letters Patent is hereby corrected as shown below:

Column 3,
Line 62, insert a space between "range," and "that".

Column 6,
Line 28, after "film" delete "is" and insert -- in --.

Signed and Sealed this

Twenty-eighth Day of August, 2001

Attest:

*Nicholas P. Godici*

NICHOLAS P. GODICI
*Attesting Officer*     *Acting Director of the United States Patent and Trademark Office*